United States Patent [19]

Johnson et al.

[11] 4,405,909

[45] Sep. 20, 1983

[54] MECHANICAL FILTER WITH BOX-TYPE COUPLING STRUCTURE

[75] Inventors: Robert A. Johnson, Tustin; Donald P. Havens, Costa Mesa, both of Calif.

[73] Assignee: Rockwell International Corporation, El Segundo, Calif.

[21] Appl. No.: 335,122

[22] Filed: Dec. 28, 1981

[51] Int. Cl.³ .................. H03H 9/50; H03H 9/205
[52] U.S. Cl. .................. 333/198; 333/187; 333/197
[58] Field of Search ............... 333/186–187, 333/197–201

[56] References Cited

U.S. PATENT DOCUMENTS 3,015,789  1/1962  Honda et al. ............... 333/187

FOREIGN PATENT DOCUMENTS 1218083  5/1966  Fed. Rep. of Germany ...... 333/198
 965731  8/1964  United Kingdom ............. 333/198

OTHER PUBLICATIONS

Y. Tomikawa, D. P. Havens, R. A. Johnson and S. Sugawara, "Resonances in Flexure-Mode Mechanical Filters", Proceedings of 1976 Ultrasonics Symposium, Sep. 1976, pp. 597–601.

M. Konno, S. Sugawara, Y. Tomikawa and R. A. Johnson, "Mounted Free-Free Flexural Bar Resonator and Mechanical Filter", Proceedings of International Symposium on Circuits and Systems, Jun. 1979, pp. 1068–1071.

R. A. Johnson, "Mechanical Filters Take on Selective Jobs", *Electronics*, Oct. 13, 1977, pp. 81–85.

*Primary Examiner*—Marvin L. Nussbaum
*Attorney, Agent, or Firm*—Michael E. Taken; V. Lawrence Sewell; Howard R. Greenberg

[57] ABSTRACT

A mechanical bandpass filter of the cascaded flexure mode resonator bar type is provided with a coupling structure improving strength an reducing rigid-body spurious modes. Coupling wires are provided on both the top and bottom surfaces of the resonator bars, not just in a single plane.

6 Claims, 9 Drawing Figures

MECHANICAL FILTER WITH BOX-TYPE COUPLING STRUCTURE

TECHNICAL FIELD

The invention relates to mechanical filters using cascaded flexure-mode bar resonators, and more particularly to a coupling structure combination providing both increased strength and wider bandwidth.

BACKGROUND

Mechanical filters composed of cascaded flexure-mode bars and coupling wires are known: Y. Tomikawa, D. P. Havens, R. A. Johnson and S. Sugawara, "Resonances in Flexure-Mode Mechanical Filters", Proceedings of 1976 Ultrasonics Symposium, Sept., 1976, pp. 597–601; M. Konno, S. Sugawara, Y. Tomikawa and R. A. Johnson, "Mounted Free-Free Flexural Bar Resonator and Mechanical Filter", Proceedings of International Symposium on Circuits and Systems, June, 1979, pp 1068-1071; and R. A. Johnson "Mechanical Filters Take On Selective Jobs", *Electronics*, Oct. 13, 1977, pp. 81–85. The coupling wires are located on a single plane, such as the top or the bottom surfaces of the resonator bars. These filters suffer from problems of inadequate strength, in the case of narrow filter bandwidths, and from spurious response problems, in the case of wide filter bandwidths.

The narrow bandwidth filter requires small diameter coupling wires to achieve the requisite small acoustic coupling between the resonators. The small diameter wires lack the physical strength to support the filter under high shock and vibration conditions.

Wide bandwidth filters require larger diameter coupling wires than narrow bandwidth filters. The increased coupling wire diameter raises the frequencies of the filter spurious responses, which are due to rigid-body modes. In some filter designs, these higher spurious frequencies fall close to the filter passband, degrading filter performance. In addition, the effect of these rigid-body modes is more pronounced in the wideband case because the stopbands and transition bands of the wide passband filters are wider and are more likely to be in the region of the spurious responses. The effect of these rigid-body modes is to often cause unwanted amplitude variations in the stopband, transition band, and passband of the filter.

Previous attempts to reduce spurious responses have involved the size and position of coupling wire welds, the addition of a third wire in the plane of the two torsional mode coupling wires, and variations of coupling wire and support wire lengths, as shown in the above noted references. Attempts to improve strength characteristics have involved increasing the bar resonator size, changing resonator spacing, and the use of higher order modes of vibration. These attempts to reduce spurious response effects and to increase strength have resulted in marginal improvements. Unfortunately, these small improvements are commonly negated by variations in manufacturing processes.

There is a need for a substantial, quantum level improvement in increased stength and in reduced spurious response. There is a further need for a simple and cost effective solution, particularly with regard to manufacturability.

SUMMARY

The present invention solves both problems of strength and rigid-body spurious modes by moving the coupling from a single plane to two planes, one being the top plane of the resonator bars and the other being the bottom plane of the resonator bars. The one or two wires of prior single plane coupling structures are replaced in preferred form by four wires, two attached to the top surfaces of the resonator bars and the other two attached to the bottom surfaces of the resonator bars. This box-type or parallelepiped type coupling structure is simple, yet effective.

DESCRIPTION OF PRIOR ART

Figure 1:
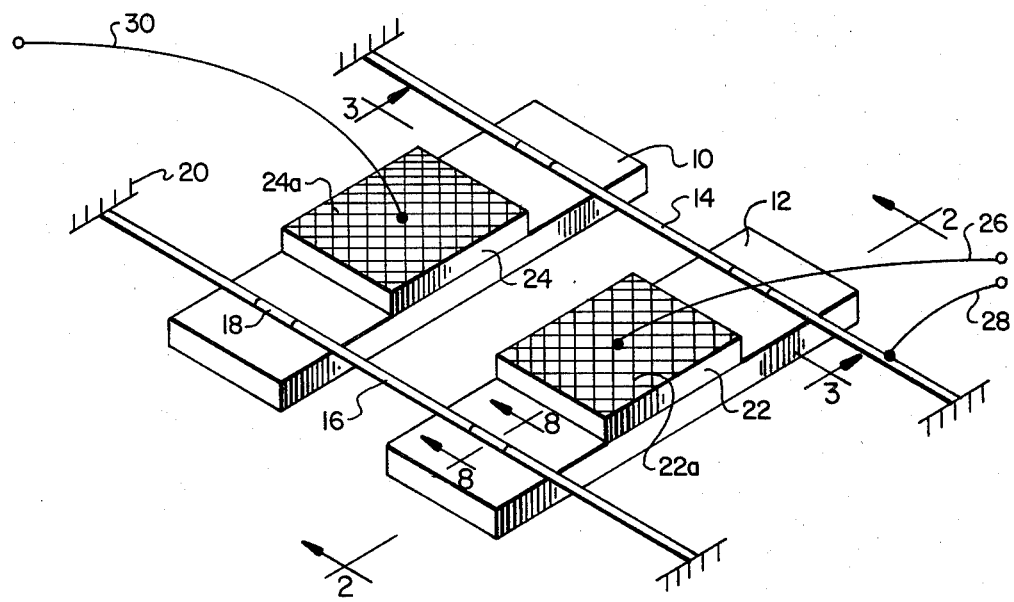
FIG. 1 is a schematic illustration of a conventional mechanical filter using cascaded flexure-mode bar resonators.

FIG. 1 shows a conventional two resonator, acoustically coupled, flexure-mode type mechanical bandpass filter. A pair of flexure-mode resonator bars 10 and 12 are positioned in spaced parallel planar relation by a coupling structure comprising a pair of coupling wires 14 and 16. These coupling wires are in spaced parallel coplanar relation and extend perpendicularly across the resonator bars, being attached thereto in any suitable manner, for example by weldments such as 18. Coupling wires 14 and 16 are attached at their ends to a suitable supporting structure or frame 20, Robert A. Johnson, "Mechanical Filters Take On Selective Jobs", *Electronics*, Oct. 13, 1977, p. 81.

Figure 2:
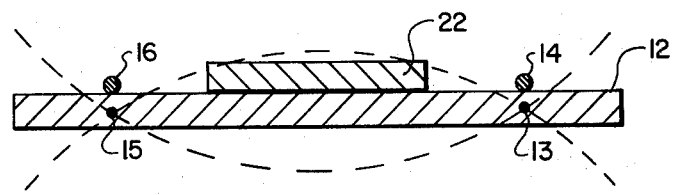
FIG. 2 is a cross sectional view taken along line 2—2 of FIG. 1, and shows flexure-mode vibration.

Mounted on the top surfaces of the bars are transducer means, such as piezoelectric-ceramic transducers 22 and 24. In operation, an input signal is applied to top electrode 26 which is connected to the top-plated surface 22a of transducer 22. The bottom surface of transducer 22 is grounded through resonator bar 12 and coupling wire 14 to ground terminal 28. The voltage across transducer 22 causes it to expand and contract along its length, causing the entire structure of FIG. 1 to vibrate in flexure as shown in FIG. 2. Ths vibration causes transducer 24 to expand and contract, which in turn induces an output voltage on lead 30 connected to the top plated surface 24a. This operation is conventional and well known in the art.

Figure 3:
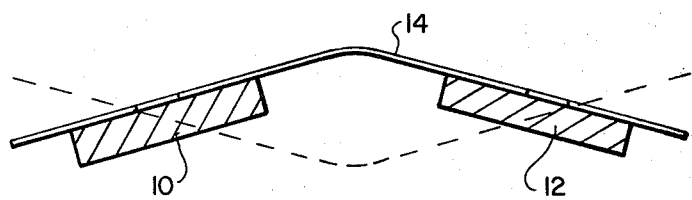
FIG. 3 is a cross sectional view taken along line 3—3 of FIG. 1, and shows fundamental rigid-body mode resonance.
Figure 4:
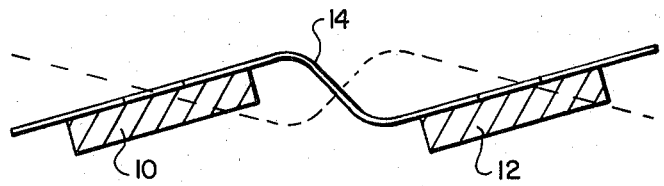
FIG. 4 is a view like FIG. 3 and shows first overtone rigid-body mode resonance.

The bandwidth of the filter of FIG. 1 may be made wider by increasing the diameter of coupling wires 14 and 16. However, this raises the rigid-body mode frequencies into the region of the filter transition band and passband. FIGS. 3 and 4 are taken along line 3—3 of FIG. 1 and show the fundamental and first overtone rigid-body modes, respectively. The structure of FIG. 1 is relatively flexible and this results in low mechanical resonant frequencies of the rigid body modes, and in poor resistance to shock and vibration.

DESCRIPTION OF THE INVENTION

Figure 5:
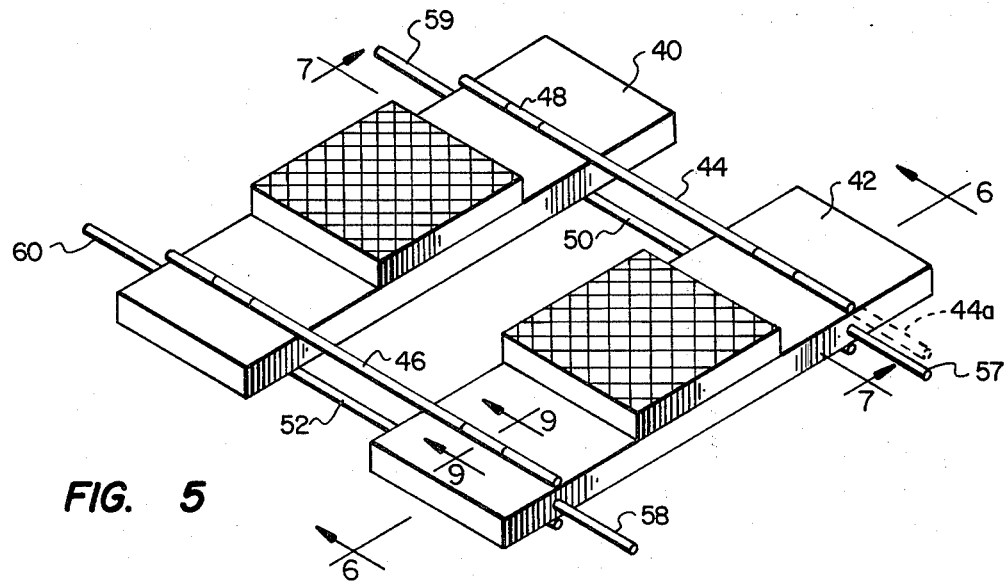
FIG. 5 is a schematic illustration of a mechanical bandpass filter constructed in accordance with the invention.

FIG. 5 shows a mechanical bandpass filter and box-type coupling structure combination constructed in accordance with the invention. The filter of FIG. 5 has a pair of flexure mode resonators 40 and 42 positioned in spaced parallel planar relation by a box-type coupling structure comprising coupling means on both planar sides of the resonators. This coupling means comprises a first pair of spaced parallel coupling wires 44 and 46 extending perpendicularly across and attached to the resonators 40 and 42, for example by weldments such as at 48, on one planar side thereof, such as the top side. The coupling means further comprises a second pair of spaced parallel coupling wires 50 and 52 extending perpendicularly across and attached to resonators 40 and 42 on the other planar side thereof, e.g., the bottom side.

Figure 6:
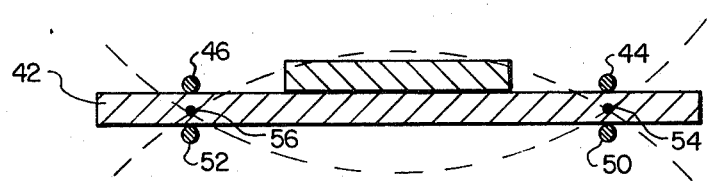
FIG. 6 is a cross sectional view taken along line 6—6 of FIG. 5, and shows flexure-mode vibration.

One coupling wire 44 of the first pair and one coupling wire 50 of the second pair are opposite each other on opposite planar sides of resonators 40 and 42 proximate one nodal axis 54 thereof, FIG. 6. Nodal axis 54 is comparable to nodal axis 13 of FIG. 2. Coupling wires 44 and 50 do not have to be directly above and below the nodal point or axis 54. In wide bandwidth designs, there is more than adequate wire diameter for strength, so the wires can be laterally offset from the nodal axis and still be within requisite proximity thereto. The other coupling wire 46 of the topside first pair and the other coupling wire 52 of the bottomside second pair are opposite each other on opposite planar sides of resonators 40 and 42 proximate another nodal axis 56, comparable to nodal axis 15 of FIG. 2.

The filter of FIG. 5 may have support means for mounting the resonators along their nodal axes 54 and 56, such as by support rods or wires 57–60 attached to respective resonator bars. The filter of FIG. 5 may optionally be supported by extensions of a selected combination of top and/or bottom coupling wires, as shown schematically at 44a. The electrode connection is the same as FIG. 1, and is omitted for clarity.

Figure 7:
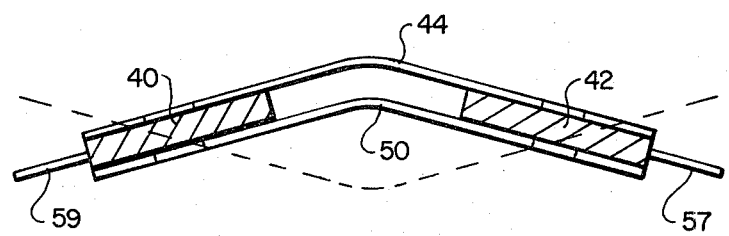
FIG. 7 is a cross sectional view taken along line 7—7 of FIG. 5, and shows the fundamental rigid-body mode resonance.

With regard to the frequency response characteristics of the filter as affected by rigid-body modes, FIG. 7, the coupling wires 44 and 50, and 46 and 52, cause the box structure of FIG. 5 to be much stiffer than the conventional design of FIG. 1. The stiffer the structure, the higher in frequency are the rigid-body mode resonances; and therefore, a reduced number of rigid-body modes will fall in the frequency region near the filter passband. Adjustments can be made in the frequencies of the rigid-body modes by increasing the diameter of coupling wire 44 relative to coupling wire 50, or vice versa, and likewise for coupling wires 46 and 52.

Figure 8:
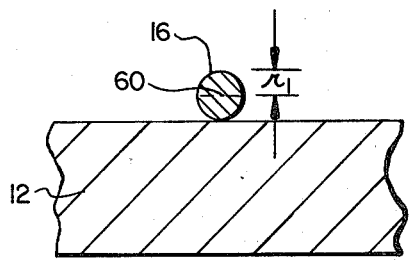
FIG. 8 is a cross sectional view taken along line 8—8 of FIG. 1, and shows the neutral axis of the conventional design.
Figure 9:
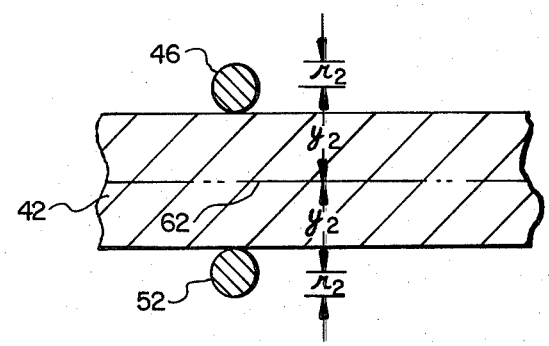
FIG. 9 is a cross sectional view taken along line 9—9 of FIG. 5, and shows the neutral axis of the present design.

Under shock or vibration conditions, the filter is subjected to bending moments resulting from the vertical forces of the resonator masses applied to the coupling wires. Assuming equal coupling wire lengths, the bending moments applied to the coupling wires of the filters of FIGS. 1 and 5 are equal. The stresses in the wires are related to the moment of inertia of each section and the distance of the wire material from the neutral axis of the bending section. FIGS. 8 and 9 provide a comparison of the two-wire and four-wire design, respectively, with neutral axes 60 and 62. At a neutral axis, there is neither compression nor tension during bending, i.e., there is compression above the neutral axis and tension below the neutral axis, or vice versa.

The stress $S_1$ at the outermost portion of single wire 16, FIGS. 1 and 8, subjected to a bending moment M is:

$$S_1 = \frac{Mr_1}{I_1} = \frac{Mr_1}{\frac{(\pi r_1^4)}{4}} = \frac{4M}{\pi r_1^3} \qquad \text{Equation 1}$$

where $I_1$ is the moment of inertia of wire 16, and $r_1$ is the radius of wire 16. In the present invention, the stress $S_2$ on the two coupling wires 46 and 52, FIGS. 5 and 9, subjected to bending moment M is:

$$S_2 = \frac{My_2}{I_2} = \frac{My_2}{(2y_2^2 \pi r_2^2)} = \frac{M}{2y_2 \pi r_2^2} \qquad \text{Equation 2}$$

where $I_2$ is the moment of inertia of the section composed of coupling wires 46 and 52, $r_2$ is the raduis of each of coupling wires 46 and 52, $y_2$ is the distance from the center of each of coupling wires 46 and 52 to the neutral axis (the center of resonator bar 42), and where $$I_2 = \int_A y^2 dA = 2y_2^2 \pi r_2^2. \qquad \text{Equation 3}$$

The filter bandwidth is proportional to the coupling wire radius, to the fourth power, times the number of wires. Therefore, to hold the bandwidth constant, $$r_2 = \frac{r_1}{2^{\frac{1}{4}}} \qquad \text{Equation 4}$$

and $$r_2^2 = \frac{r_1^2}{\sqrt{2}} \qquad \text{Equation 5}$$

Substituting Equation 5 into Equation 2 we obtain $$S_2 = \frac{M}{2y_2\pi \left(\frac{r_1^2}{\sqrt{2}}\right)} = \frac{M}{\sqrt{2}\, \pi y_2 r_1^2}. \qquad \text{Equation 6}$$

The ratio of the stresses is $$\frac{S_2}{S_1} = \frac{\frac{M}{\sqrt{2}\, \pi y_2 r_1^2}}{\frac{4M}{\pi r_1^3}} = \frac{r_1}{4\sqrt{2}\, y_2}. \qquad \text{Equation 7}$$

As an example, for the case where $y_2 = 2r_1$, it is seen from Equation 7 that:

$$\frac{S_2}{S_1} = \frac{r_1}{4\sqrt{2}\,(2r_1)} = \frac{1}{8\sqrt{2}} \approx \frac{1}{11}.$$ Equation 8

In other words, the stress has decreased by 11 to 1, and the strength has increased by 11 to 1.

It is recognized that various modifications are possible within the scope of the appended claims.

We claim:

1. A mechanical bandpass filter comprising:
a pair of flexure-mode resonators each having first and second opposing planar sides, positioned in juxtaposed but spaced parallel planar relation by a parallelpiped-type coupling structure comprising wire-like coupling means having longitudinal axis on both planar sides of said resonators wherein flexure of said resonators causes primarily twisting of said coupling around said longitudinal axis thereof.

2. The invention according to claim 1 wherein said coupling means comprises:
a first pair of spaced parallel coupling wires extending perpendicularly across and attached to said resonators on one planar side thereof; and
a second pair of spaced parallel coupling wires extending perpendicularly across and attached to said resonators on the other planar side thereof.

3. The invention according to claim 2 wherein:
one coupling wire of said first pair and one coupling wire of said second pair are opposite each other on said opposite planar sides of said resonators proximate one nodal axis thereof; and
the other coupling wire of said first pair and the other coupling wire of said second pair are opposite each other on said opposite planar sides of said resonators proximate another nodal axis thereof.

4. The invention according to claim 3 wherein rigid-body mode resonant frequency is adjustable according the diameter of said first pair of coupling wires relative to said second pair of coupling wires.

5. The invention according to claim 4 comprising support means for mounting said resonators along said nodal axes.

6. The invention according to claim 4 wherein the diameter of said first pair of coupling wires is equal to the diameter of said second pair of coupling wires, and said nodal axes are midway between respective said coupling wires.

* * * * *